(12) United States Patent
Kawasaki (10) Patent No.: US 6,297,113 B1
(45) Date of Patent: Oct. 2, 2001

(54) METHOD OF MANUFACTURING A SEMICONDUCTOR DEVICE, AND A SEMICONDUCTOR DEVICE MANUFACTURED THEREBY

(75) Inventor: Youji Kawasaki, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/161,745

(22) Filed: Sep. 29, 1998

(30) Foreign Application Priority Data

Apr. 3, 1998 (JP) ................................. 10-091462

(51) Int. Cl.⁷ ................................................ H01L 21/336
(52) U.S. Cl. ...................... 438/305; 438/440; 438/655; 438/656; 438/657
(58) Field of Search ................................. 438/195, 228, 438/235, 238, 655, 656, 657, 660, 664, 684, 683, 440, 439, 305, 237, 236; 29/571, 576, 579, 580

(56) References Cited

U.S. PATENT DOCUMENTS

| | | | |
|---|---|---|---|
| 4,372,033 | * 2/1983 | Chiao | 29/571 |
| 4,931,406 | 6/1990 | Tomioka . | |
| 5,234,850 | * 8/1993 | Liao | 437/44 |
| 5,279,973 | 1/1994 | Suizu . | |
| 5,324,974 | * 6/1994 | Liao | 257/344 |
| 5,525,529 | 6/1996 | Guldi . | |
| 5,674,783 | * 10/1997 | Jang et al. | 437/195 |
| 5,933,741 | * 8/1999 | Tseng | 438/305 |
| 5,976,952 | * 11/1999 | Gardner et al. | 438/440 |
| 5,981,383 | * 11/1999 | Lur et al. | 438/655 |
| 6,015,990 | * 1/2000 | Hieda et al. | 257/310 |

FOREIGN PATENT DOCUMENTS

| | | |
|---|---|---|
| 197 27 492 A1 | 1/1998 | (DE) . |
| 58-39014 | 3/1983 | (JP) . |
| 59-50563 | 5/1984 | (JP) . |
| 59-108316 | 6/1984 | (JP) . |
| 60-120572 | 6/1985 | (JP) . |
| 1-161752 | 6/1989 | (JP) . |
| 4-152518 | 5/1992 | (JP) . |
| 5-74729 | 3/1993 | (JP) . |
| 5-152237 | 6/1993 | (JP) . |
| 6-232071 | 8/1994 | (JP) . |
| 6-252354 | 9/1994 | (JP) . |
| 7-263683 | 10/1995 | (JP) . |
| 8-055813 | 2/1996 | (JP) . |

* cited by examiner

Primary Examiner—Chandra Chaudhari
Assistant Examiner—Laura M Schillinger
(74) Attorney, Agent, or Firm—McDermott, Will & Emery (57) ABSTRACT

There is described a semiconductor device manufacturing method which enables substantial elimination of oxygen atoms or crystalline imperfections included in a gate oxide film of an element fabricated on a well which is formed in a semiconductor substrate by means of high-energy ion implantation. An element whose gate oxide film has a high degree of reliability is manufactured by combining manufacturing conditions for forming a pad film on the surface of a substrate such as the type and thickness of the pad film, the valence of ions to be implanted, an implantation energy, and ion implantation before or after removal of the pad film. If necessary, post-implantation annealing conditions or conditions for growing a sacrificial oxide film are selected.

14 Claims, 9 Drawing Sheets

| Embodiments | Pad Oxide Film Thickness tp (nm) | Implantation Energy E (MeV) | Valence of Ion | Thickness of Gate Oxide Film tg (nm) | Deterioration and Recovery of Gate Oxide Film | Annealing Conditions for Recovering — Nitrogen Atmosphere Furnace FA — Temperature T (°C); Time M (min) | Annealing Conditions for Recovering — Lamp Anneal Furnace RTA — Temperature T (°C); Time M (min) |
|---|---|---|---|---|---|---|---|
| First Embodiment (ions are implanted after removal of a pad oxide film) | 3<Tp≤20 Thin Pad Film | 0.4≤E≤3.0 | + | 4.0≤tg≤25.0 | No Deterioration | — | — |
| | | 0.4≤E<1.6 | ++ / +++ | 4.0≤tg≤7.5 | Deteriorated (recovered under the conditions written on the right side) | 900<T≤1000 30≤M≤60 | — |
| | | 1.6≤E<2.4 | +++ / +++ | 7.5<tg≤25.0 | | 700≤T<800 30≤M≤60 or 900<T≤1000 30≤M≤60 | 700≤T≤1000 0.5≤M≤1.0 |
| | | 2.4≤E≤3.0 | +++ | 4.0≤tg≤25.0 | | | |
| Second Embodiment (ions are implanted from above a pad oxide film) | 20<Tp≤30 Thick Pad Film | 0.4≤E<1.0 | + | 4.0≤tg≤25.0 | No Deterioration | — | — |
| | | 1.0≤E<1.6 | ++ / +++ | | Deteriorated (recovered under the conditions written on the right side) | 700≤T<800 30≤M≤60 or 900<T≤1000 30≤M≤60 | 700≤T≤1000 0.5≤M≤1.0 |
| | | 1.6≤E<2.4 | ++ / +++ | | | 700≤T≤1000 30≤M≤60 | |
| | | 2.4≤E≤3.0 | +++ | | | | |

(Note 1) Valence of Ion to be implanted—Use any, if there are many valences; and
(Note 2) Lamp Anneal Furnace RTA—Programming rate of 5°C/sec. or more

METHOD OF MANUFACTURING A SEMICONDUCTOR DEVICE, AND A SEMICONDUCTOR DEVICE MANUFACTURED THEREBY

BACKGROUND OF THE INVENTION

1. Field of the Invention

The present invention generally related to a method of manufacturing a semiconductor device and a semiconductor device manufactured thereby, and more particularly, to a semiconductor device manufacturing method wherein a well is formed in a semiconductor substrate by high-energy ion implantation.

2. Description of the Background Art

A semiconductor manufacturing method—by which, a well is formed by high-energy ion implantation after an isolating oxide film for separating element regions has been formed—is described in, e.g., (1) Japanese Patent Application Laid-open No. 6-252354 and (2) Japanese Patent Application Laid-open No. 5-74729. More specifically, reference (1) discloses a method comprising the steps of forming an isolating oxide film; forming a resist mask having an opening on a silicon nitride film used for forming the isolating oxide film as well as on the isolating oxide film, by omission of formation of a thermal oxide film commonly called a pad film; and forming a well by implanting ions through the opening. Reference (2) discloses a method comprising the steps of: forming a doped polysilicon cover film in place of a pad oxide film; implanting ions into a substrate through an opening formed in a resist mask; and subjecting the substrate to heat treatment for 6 hrs. at 1200° C., thus forming a well.

The pad film plays a role in preventing introduction of undesirable impurities into a substrate from a resist mask or from outside the substrate at the time of ion implantation or heat treatment following the ion implantation. When high-energy ions pass through the pad oxide film, there occurs a knock-on phenomenon in which oxygen atoms are knocked on from the oxide film. Because of this phenomenon, there arises a problem of electrical properties of an element formed on a well being deteriorated by excessive oxygen atoms mixed into the surface of the substrate or by crystalline imperfections in a monocrystalline area within the substrate.

According to the technique described in reference (1), it is necessary to change implantation energy several times in a stepped manner in order to form a uniform well. Further, since the technique uses a silicon nitride film which is as thick as 100 nm, a great noncontiguous region arises along a boundary area between the silicon nitride film and the isolating oxide film. For this reason, the technique is not suitable for formation of a well of a microminiature LSI. Further, the reference does not at all describe knocked-on oxygen atoms. The technique described in reference (2) is intended to solve the problem stemming from the pad oxide film, through use of the cover film. However, the technique suffers a drawback of a substrate being subjected to heat treatment for a long period of time at high temperature.

Recent LSI chips are made compact and have their structure further complicated. For this reason, there exists a strong demand for both a reduction in thermal load on a semiconductor device throughout the entire manufacturing process and an improvement in reliability of the device so as to ensure a longer life of the device.

The present invention has been conceived to solve the aforementioned problems, and a first object of the present invention is to provide a semiconductor device manufacturing method which enables a considerable reduction in the amount of oxygen atoms included in a gate oxide film formed on a well or a considerable reduction in the degree of crystalline imperfection.

A second object of the present invention is to provide a semiconductor device manufacturing method which enables a recovery or improvement in the life of a gate oxide film of an element formed on a well through heat treatment at a comparatively low temperature.

A third object of the present invention is to provide an optimum combination of transistor structural parameters, conditions for ion implantation, and conditions for heat treatment, which is required for achievement of a recovery or improvement in the life of a gate oxide film.

SUMMARY OF THE INVENTION

The above objects of the present invention are achieved by a semiconductor device manufacturing method (first method). The method includes an element region formation step of forming an element region by separating the surface of a semiconductor substrate through use of an isolating oxide film. The method also includes a pad film formation step of forming a pad film on the surface of the element region. The method further includes a first well formation step of forming a resist mask having an opening in a first given region on the pad film and on the isolating oxide film, removing the pad film from the inside of the opening, forming a well in the semiconductor substrate by implantation of ions of the first conductivity type into the opening, and removing the resist mask. Moreover, the method includes a dielectric film formation step of forming a dielectric film for use as a gate dielectric film on the surface of the well by means of thermal oxidation.

The above objects of the present invention are also achieved by the semiconductor device manufacturing method wherein a second well formation step is provided between the pad film formation step and the dielectric film formation step (second method). The step comprises formation of a resist mask having an opening in a second given region on the pad film and the isolating oxide film, removal of the pad film from the inside of the opening, formation of a well in the semiconductor substrate by implantation of ions of the second conductivity type into the opening, and removal of the resist mask.

The above objects of the present invention are also achieved by the semiconductor device manufacturing method wherein a third well formation step is provided between the pad film formation step and the dielectric film formation step (third method). The step comprises formation of a resist mask having an opening in a second given region on the pad film and the isolating oxide film, formation of a well in the semiconductor substrate still having the pad film formed thereon by implantation of ions of the second conductivity type into the opening, and removal of the resist mask.

The above objects of the present invention are also achieved by the semiconductor device manufacturing method wherein a sacrificial oxide film step is provided between the first well formation step and the dielectric film formation step (fourth method). The step comprises formation of a sacrificial oxide film through thermal oxidation on the surface of the well from which the pad film is removed and removal of the sacrificial oxide film.

The above objects of the present invention are also achieved by a semiconductor device manufacturing method (fifth method). The method includes an element region formation step of forming an element region by separating the surface of a semiconductor substrate through use of an isolating oxide film. The method also include a pad film formation step of forming a pad film on the surface of the element region. The method further includes a fourth well formation step of forming a resist mask having an opening in a first given region on the pad film and on the isolating oxide film, forming a well in the semiconductor substrate still having the pad film formed thereon by implantation of ions of the first conductivity type into the opening, and removing the resist mask. The method further includes an annealing step of annealing the surface of the well having the pad film still formed thereon in a nitrogen atmospheric furnace or a rapid thermal annealing furnace and of removing the pad film. Moreover, the method includes a dielectric film formation step of forming a dielectric film for use as a gate dielectric film on the surface of the well by means of thermal oxidation.

The above objects of the present invention are also achieved by the semiconductor device manufacturing method wherein a fifth well formation step is provided between the pad film formation step and the annealing step (sixth method). The step comprises formation of a resist mask having an opening in a second given region on the pad film and the isolating oxide film, formation of a well in the semiconductor substrate still having the pad film formed thereon by implantation of ions of the second conductivity type into the opening, and removal of the resist mask.

The first through sixth methods discussed foregoing have the effect of being able to considerably reduce the amount of oxygen atoms included in a gate oxide film formed on a well or crystalline imperfections, by means of selective combination of ion implantation steps suitable for the type of oxygen-containing or oxygen-free pad film.

The above objects of the present invention are also achieved by the semiconductor device manufacturing method wherein the pad film formation step comprises formation of a silicon oxide film of a thickness within a range of 3 to 30 nm by means of thermal oxidation of a semiconductor silicon substrate (seventh method).

The above objects of the present invention are also achieved by the semiconductor device manufacturing method wherein the sacrificial oxide film formation step comprises formation of a silicon oxide film of a thickness within a range of 1 to 30 nm by means of thermal oxidation of the semiconductor silicon substrate, and removal of the silicon oxide film (eighth method).

The above objects of the present invention are also achieved by the semiconductor device manufacturing method wherein the dielectric film formation step comprises formation of a silicon oxide film of a thickness within a range of 4 to 25 nm by means of thermal oxidation of the semiconductor silicon substrate (ninth method).

The seventh through ninth methods have the effect of being able to improve the reliability of a device including a silicon substrate, a well, and a gate oxide film formed on the well, such as a PMOS, NMOS, CMOS, or Bi-MOS transistor, by means of an ion implantation method by which a pad oxide film, a sacrificial oxide film, and a gate oxide film are selectively and appropriately combined in thickness.

The above objects of the present invention are also achieved by the semiconductor device manufacturing method wherein the pad film formation step comprises formation of a silicon oxide film by means of thermal oxidation of a semiconductor silicon substrate at temperature within a range of 1000 to 1100° C., the sacrificial oxide film formation step comprises formation of a silicon oxide film by means of thermal oxidation of a semiconductor silicon substrate at temperature lower than that of the pad film formation step; and the dielectric film formation step comprises formation of a silicon oxide film by means of thermal oxidation of the semiconductor silicon substrate at temperature lower than that of the sacrificial oxide film step. (tenth method).

The tenth method has an effect of being able to reliably improve the reliability of a gate oxide film under slight thermal load, by means of an ion implantation method by which thermal oxidation temperatures for the pad oxide film, the sacrificial oxide film, and the gate oxide film are selectively and appropriately combined.

The above objects of the present invention are also achieved by the semiconductor device manufacturing method wherein the pad film formation step comprises formation of a silicon nitride film of a thickness within a range of 3 to 30 nm by means of CVD (eleventh method).

The eleventh method has an effect of being able to recover or improve the reliability of a gate oxide film with a small number of steps and through heat treatment at comparatively low temperature, by means of an ion implantation method by which the pad nitride film, the annealing of the substrate in a nitride furnace or an RTA furnace, and the gate oxide film are selectively combined.

The above objects of the present invention are also achieved by the semiconductor device manufacturing method wherein the first well formation step comprises solo use of any of monovalent, bivalent, or trivalent ions or combined use of ions having different valences. The ions are any of phosphor, arsenic, or boron (twelfth method).

The twelfth method has an effect of being able to significantly reduce the amount of oxygen atoms included in the gate oxide film formed on the well or crystalline imperfections, by means of an ion implantation method using multivalent ions.

The above objects of the present invention are also achieved by the semiconductor device manufacturing method wherein the annealing step comprises heat treatment at temperature within a range of 700 to 1000° C. for a period within a range of 30 to 60 min. in the nitrogen atmospheric furnace or heat treatment at temperature 700 to 1000° C. for a period within a range of 30 to 60 sec. at a temperature rise rate of 5° C./sec. or more in the rapid thermal annealing furnace (thirteenth method).

The thirteenth method has an effect of being able to quickly recover or improve the reliability of the gate oxide film at comparatively low temperature, by means of an ion implantation method wherein the substrate to which ions are implanted from above a pad film is selectively combined with an annealing operation of the nitrogen furnace or of the RTA furnace.

The above objects of the present invention are also achieved by the semiconductor device manufacturing method wherein the pad film formation step comprises formation of a pad film into a single-layer structure or a multilayered structure from material selected from silicon oxide ($SiO_2$), silicon oxide ($Si_xO_y$) having a stoichiometric amount of oxygen smaller than that of silicon oxide ($SiO_2$), nitride-oxide silicon ($Si_xO_yN_z$) silicon nitride ($Si_3N_4$), silicon nitride ($Si_xN_y$) having a stoichiometric amount of nitrogen smaller than that of silicon nitride ($Si_3N_4$), silicide ($CoSi_2$, $TiSi_2$, $WSi_2$), or titanium nitride (TiN) (fourteenth method).

The fourteenth method has an effect of being applicable to a wide variety of devices having a highly-reliable gate oxide film, by selective combination of ion implantation steps suitable for a wide range of film types from oxygen-containing pad films to oxygen-free pad films.

The above objects of the present invention are also achieved by a semiconductor device manufactured by the semiconductor manufacturing any one of foregoing methods.

Other objects and further features of the present invention will be apparent from the following detailed description when read in conjunction with the accompanying drawings.

DESCRIPTION OF THE PREFERRED EMBODIMENTS

In the following, principles and embodiments of the present invention will be described with reference to the accompanying drawings. Throughout the drawings, like reference numerals designate like or corresponding parts.

First Embodiment

Figure 1A:
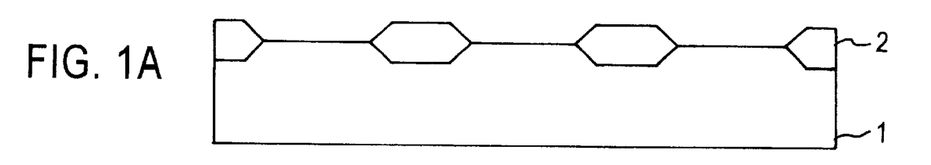
FIGS. 1A to 1E are cross-sectional views (part 1) arranged in sequential order of steps of a semiconductor device manufacturing method by which wells are formed by ion implantation according to a first embodiment of the present invention.
Figure 1B:
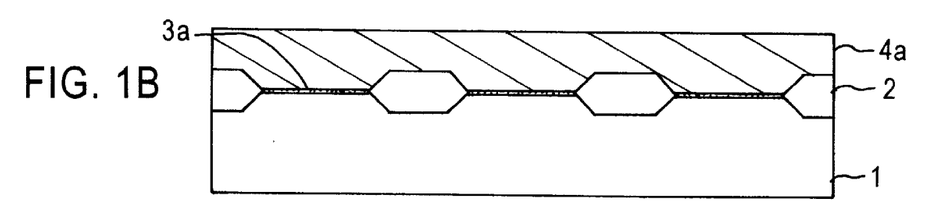
Figure 1C:
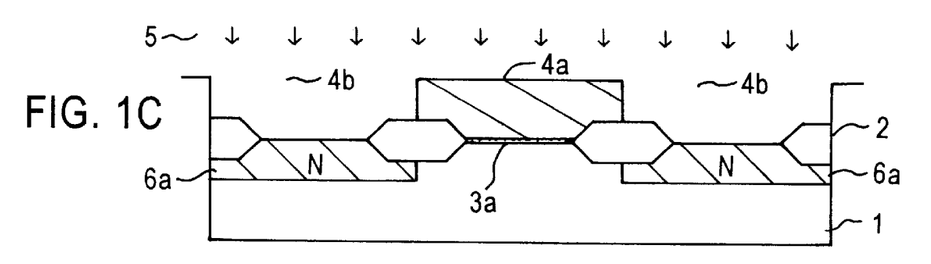
Figure 1D:
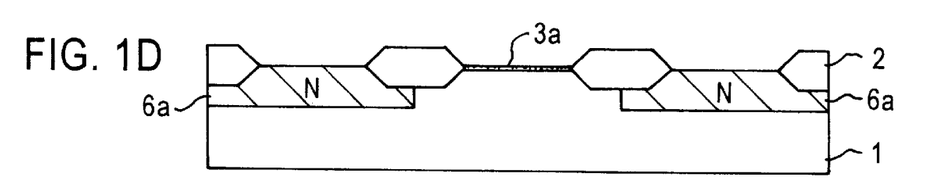
Figure 1E:
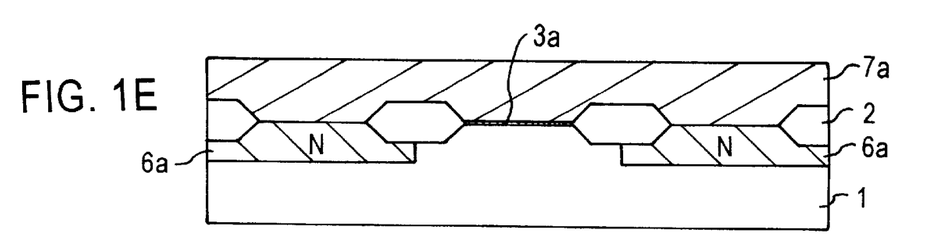
Figure 2A:
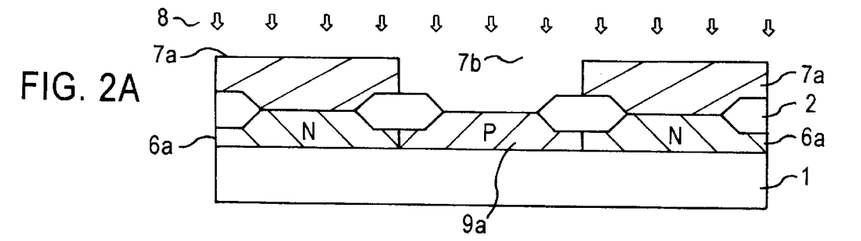
FIGS. 2A to 2E are cross-sectional views (part 2) arranged in sequential order of steps of a semiconductor device manufacturing method of forming wells by ion implantation according to the first embodiment.
Figure 2B:
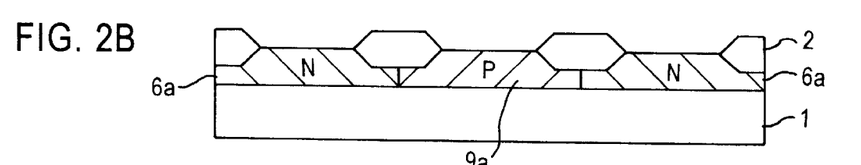
Figure 2C:
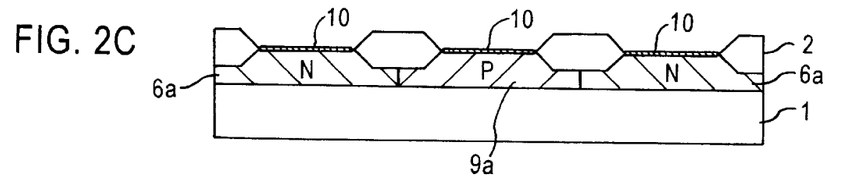
Figure 2D:
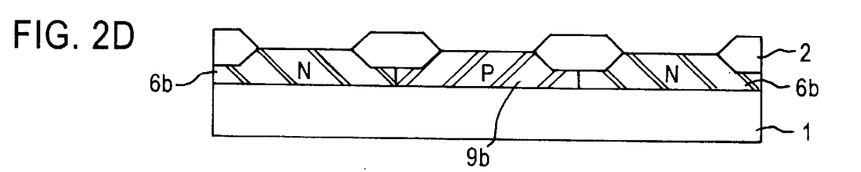
Figure 2E:
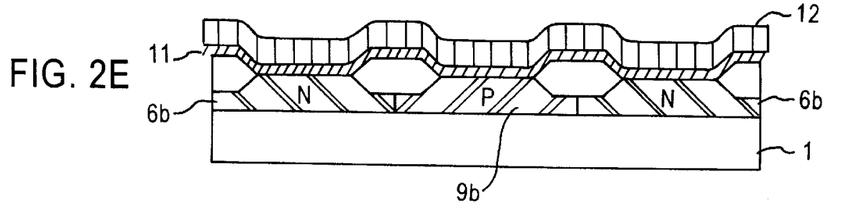
Figure 3:
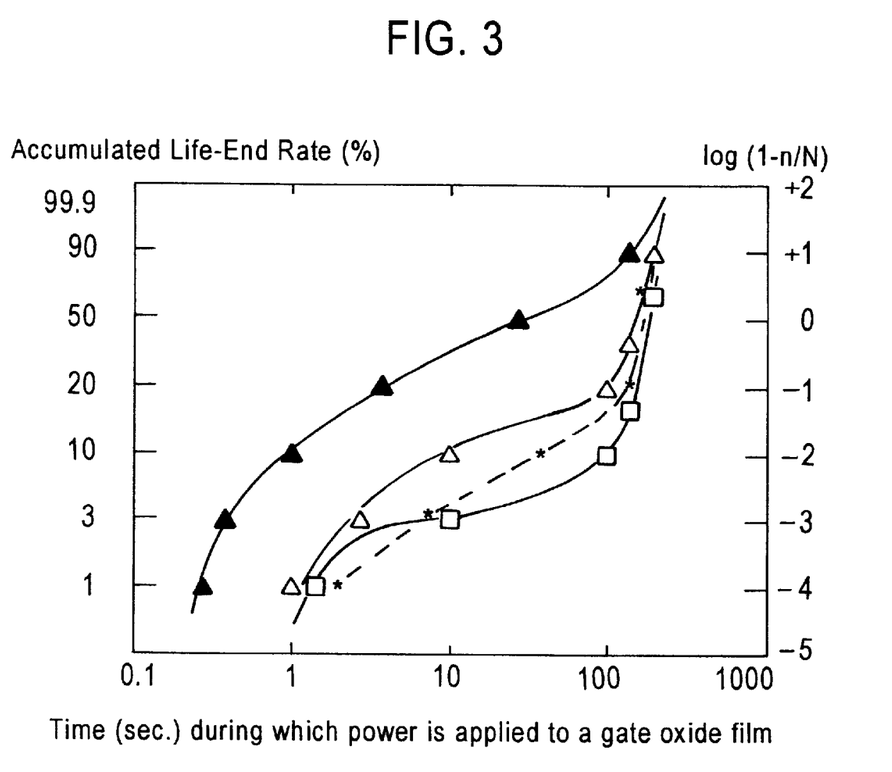
FIG. 3 is a life evaluation plot for a gate oxide film showing the effect of removal of a pad film immediately before implantation of phosphor ions and the effect of a sacrificial oxide film after implantation of phosphor ions according to the first embodiment.
Figure 4:
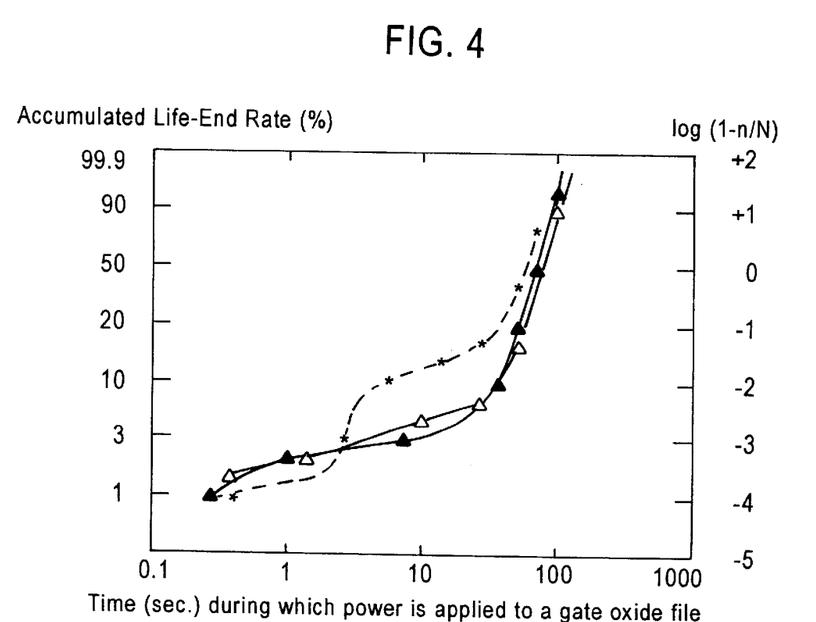
FIG. 4 is a life evaluation plot for a gate oxide film showing the effect of implantation of boron ions according to the first embodiment.

FIGS. 1 through 4 are cross-sectional views for explaining a semiconductor device manufacturing method according to a first embodiment of the present invention, wherein a well is formed by ion implantation. FIGS. 1 and 2 are cross-sectional views arranged in sequential order of steps of the semiconductor device manufacturing method; FIG. 3 is a chart showing an evaluating result of the life of a gate oxide film which exhibits the effect stemming from elimination of a pad film immediately before implantation of phosphor ions and the effect stemming from a sacrificial oxide film after implantation of phosphor ions. FIG. 4 is a chart showing an evaluating result of the life of a gate oxide film which exhibits the effect stemming from implantation of boron ions.

The sequence of steps from a step which is performed after formation of an isolating oxide film to a step for forming a gate oxide film will be described by reference to FIGS. 1 and 2.

FIG. 1A shows a P-type silicon substrate 1 from which is removed an unillustrated silicon nitride film used for forming isolating oxide films 2 on the substrate by means of thermal oxidation. Hereinafter, the step for forming the isolating oxide films 2 is referred to as a step for forming an element region. As shown in FIG. 1B, pad oxide films 3a are formed from silicon oxide $SiO_2$ under conditions in which a thermal oxidation temperature is 1050° C. and by which a film thickness of 15 nm will be obtained(a step of forming a pad film). Imperfections in the surface of the silicon substrate 1 are eliminated by the pad oxide films 3a. A resist mask 4a is formed over the pad oxide films 3a on the element regions of the thus-purified substrate 1 and the isolating oxide film 2.

As shown in FIG. 1C, the resist mask 4a is patterned so as to form openings 4b in given P-type element formation regions including the pad oxide films 3a and the isolating oxide films 2.

The pad oxide films 3 exposed through the openings 4b as a result of patterning are removed by a hydrofluoric acid, thus rendering the surface of the element regions of the substrate 1 uncovered. Monovalent phosphor ions 5 are implanted as N-type impurities into the purified surface of the substrate 1—from which the pad oxide films 3a are removed, e.g., at an energy of 1.2 MeV and at a dose of $1 \times 10^{13}$ ions/cm². As a result of the high-energy ion implantation discussed above, N-type ion-implanted layers 6a are formed in the P-type element formation regions below the respective openings 4b (a step of forming a well).

As shown in FIG. 1D, only the mask 4a is removed from the substrate 1 after the N-type ion-implanted layers 6a have been formed. Then, as shown in FIG. 1E, a new resist mask 7a is formed on the substrate 1 while the pad oxide films 3a provided below the mask 4a shown in FIG. 1C are left as are.

After the formation of the resist mask 7a, as shown in FIG. 2A, the mask 7a is patterned so as to form openings 7b on a given N-type element formation regions including the pad oxide films 3a and the isolating oxide films 2.

The pad oxide films 3a exposed through the opening 7b are removed by a hydrofluoric acid so that the surface of the substrate 1 becomes uncovered. Monovalent boron ions 8 are implanted as P-type impurities into the purified surface of the substrate 1—from which the pad oxide film 3a is removed, e.g., at an energy of 0.7 MeV and at a dose of $1 \times 10^{13}$ ions/cm². As a result of the high-energy ion implantation as discussed above, a P-type ion-implanted layers 9a are formed in the given P-type element formation regions below the openings 7b (a step of forming a well).

As shown in FIG. 2C, a new thermo-oxide films 10 are formed over the surface of the ion-implanted layers 6a and 9a which are shown in FIG. 2B and are exposed on the surface of the substrate 1 after the removal of the resist mask 7a under conditions in which a thermal oxidation temperature ranges from 850 to 900° C. and by which a thickness of 1 to 30 nm will be obtained. Subsequently, as shown in FIG. 2D, the thermal oxide film 10 is removed (a step of a sacrificial oxide film). The thermal oxide films 10 will hereinafter be referred to as a "sacrificial oxide films." The knocked-on oxygen atoms formed in the vicinity of the surface of the ion-implanted layers 6a and 9a as a result of high-energy ion implantation or crystalline imperfections occurring in the silicon substrate are taken into or removed by the sacrificial oxide films 10. Since the N-type wells 6b and the P-type wells 9b are formed in the manner as mentioned above, namely, by the high-energy implantation, they become retrograde-type wells, which are less apt to cause what is called a latch-up phenomenon.

Next, as shown in FIG. 2E, a gate oxide film 11, which will serve as a gate oxide film of an element, is formed on the purified surface of the N-type wells 6b and the P-type well 9b under conditions, e.g., in which a thermal oxidation temperature is 750° C. that is lower than the one for the sacrificial oxide film 10 and by which a film thickness of 10 nm will be obtained (a step of forming a dielectric film). Finally, a gate conductive film 12, which will serve as a gate electrode, is formed on the gate oxide film 11.

Although not illustrated, gate oxide films and gate electrodes of the element are formed subsequent to the step shown in FIG. 2E so that source electrodes and drain electrodes are formed in N-type wells 6b and the P-type well 9b, respectively. The thus-fabricated semiconductor device can be applied to a PMOS, NMOS, or CMOS transistor, an MOS capacitor, or a Bi-MOS device.

A modification of the first embodiment will now be described.

The foregoing explanation has described the sequential order of steps of the semiconductor device manufacturing method, by reference to the drawings FIG. 1A to FIG. 2E. The following sequential order of steps of the semiconductor device manufacturing method can also be employed as a modification of the first embodiment.

(i) The N-type ion-implanted layers 6a may be formed after formation of the P-type ion-implanted layer 9a by replacing the steps shown in FIGS. 1C and 1D with the steps shown in FIGS. 2A and 2B.

(ii) Although the pad oxide films 3a are removed in the steps shown in FIGS. 1C and 2A which are performed after the formation of the resist mask 4a in the foregoing embodiment, the pad oxide films 3a may be completely removed after formation thereof in the step shown in FIG. 1B, and the resist mask 4a may be formed on the substrate 1 after complete removal of the pad oxide films 3a.

(iii) Although the P-type ion-implanted layers 9a are formed after the removal of the pad oxide films 3a exposed on the openings 7b in the foregoing embodiment. The P-type ion-implanted layers 9a may be formed by implantation of the boron ions 8 as P-type impurities from above the pad oxide films 3a. In this case, the resist mask 7a may be removed after the formation of the P-type ion-implantation layers 9a, then the pad oxide films 3a are removed after the removal of the resist mask 7a, further, the step shown in 2B may be performed following the removal of the pad oxide films 3a.

(iv) The formation of the sacrificial oxide films 10 (shown in FIG. 2C) and the elimination of the same (shown in FIG. 2D) may be omitted, and there may be selected another sequential order of manufacturing steps in which the gate oxide film 11 shown in FIG. 2E is formed on the substrate 1 immediately after the step shown in FIG. 2B.

With reference to FIGS. 3 and 4, there will be described a method of evaluating the long term reliability of insulation life of the gate oxide film of a transistor which is manufactured by the method according to the first embodiment.

An evaluation test was conducted by means of a constant current stress method under which the life of the gate oxide film is tested in an accelerated manner under stress heavier than that imposed on the gate oxide film when it is used at the rated load. For example, the life of the gate oxide film was tested in an accelerated manner by application of a constant current of 1 mA/cm$^2$ to the gate oxide film having a film thickness of 10 nm. If the insulation performance of the gate oxide film is normal, a voltage of 13V can be applied between the gate oxide films. In short, the withstand voltage of the gate is 13V. The insulation performance of the gate oxide film deteriorates with elapse of the time period during which power is applied to the gate oxide film for life test. As a result, the withstand voltage of the gate sharply drops to, e.g., 9V. The point in time at which the withstand voltage of the gate sharply drops is taken as the end of the life of a test device. The horizontal axis of the plot represents a time period (sec.) during which a constant stress current is applied to the gate oxide film, and the vertical axis represents the life-end rate of an aggregation of test devices.

Each aggregation of test devices (each aggregation includes about 1000 devices) is manufactured to constant specifications, i.e., a pad oxide film having a thickness of 15 nm, monovalent phosphor ions implanted at 1.2 MeV or monovalent boron ions implanted at 0.7 MeV, a dose of $1\times10^{13}$ ions/cm$^2$, and a gate oxide film having a film thickness of 10 nm. Sample devices manufactured without involvement of ion implantation were added to the foregoing aggregations for comparison purpose.

The results of life evaluation of the gate oxide film having phosphor ions implanted will be described by reference to FIG. 3. An aggregation of test devices to which phosphor ions are implanted from above the pad oxide films are denoted by a curve of solid triangles (▲). The curve shows the shortest life among aggregations provided in FIG. 3. A curve of outlined triangles (Δ) denotes an aggregation of test devices to which phosphor ions are implanted after removal of the pad oxide films according to the modification (iv) of the first embodiment. The aggregation of test devices denoted by the curve of outlined triangles (Δ) is improved in the time period required to achieve an accumulated life-end rate of 10% relative to the aggregation of test devices depicted by the curve of solid triangles (▲), by a factor of about ten. A curve of outlined squares (□) denotes an aggregation of test devices manufactured by the method including the formation and removal of the sacrificial oxide film (shown in FIG. 2C). A curve of asterisks(*) denotes an aggregation of test devices for comparison purpose manufactured without involvement of ion implantation. The curve of outlined squares (□) shows a life curve better than that denoted by the curve of asterisks(*).

Results of life evaluation of the gate oxide film having boron ions implanted will be described by reference to FIG. 4. Substantially the same test results are shown by the three kinds of aggregations, i.e., the aggregation of test devices to which phosphor ions are implanted from above the pad oxide film according to the modification (iii) of the first embodiment and which are denoted by the curve of solid triangles (▲); the aggregation of test devices to which phosphor ions are implanted after removal of the pad oxide film according to the modification(iv) of the first embodiment and which are denoted by the curve of outlined triangles (Δ); and the aggregation of test devices for comparison purpose which are manufactured without involvement of ion implantation and which are denoted by the curve of asterisks(*). Under the foregoing conditions, there is acknowledged no deterioration of life of the gate oxide film stemming from ion implantation.

As has been described above, the method according to the first embodiment including a step of implanting phosphor ions into the substrate after removal of the pad oxide film provides the gate oxide film with superior life curves. Therefore, it is admitted that oxygen atoms contained in a gate oxide film of an element formed on a well or the amount of crystalline imperfections can be significantly reduced by the method according to the first embodiment.

Second Embodiment

Figure 5A:
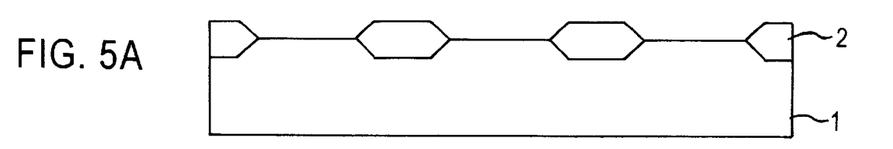
FIGS. 5A to 5E are cross-sectional views (part 1) arranged in sequential order of steps of a semiconductor device manufacturing method of forming wells by ion implantation according to a second embodiment of the present invention.
Figure 5B:
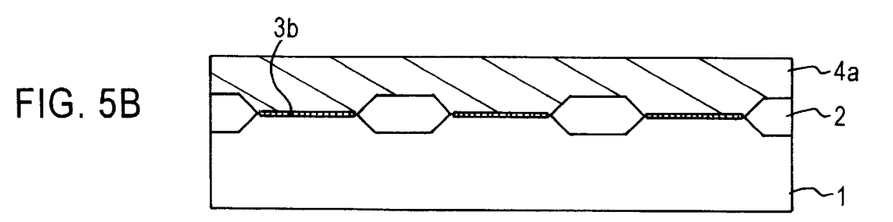
Figure 5C:
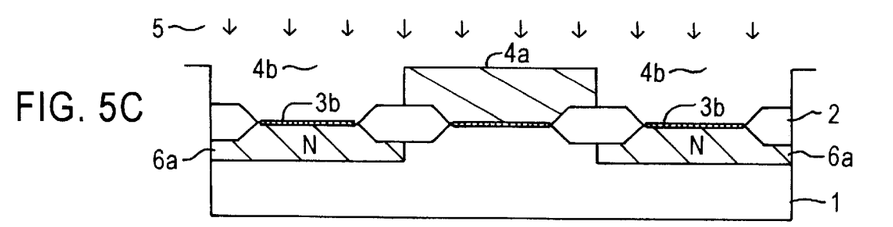
Figure 5D:
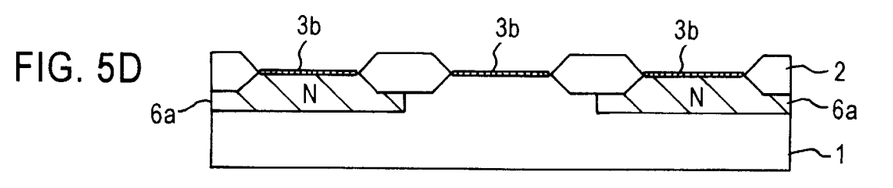
Figure 5E:
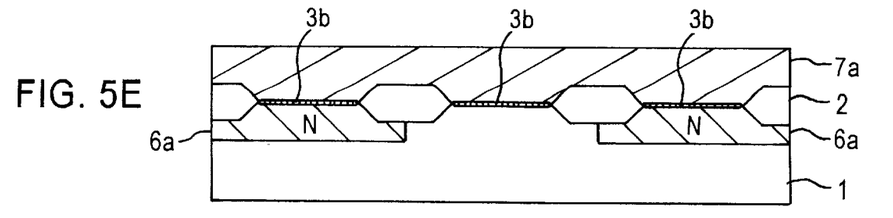
Figure 6A:
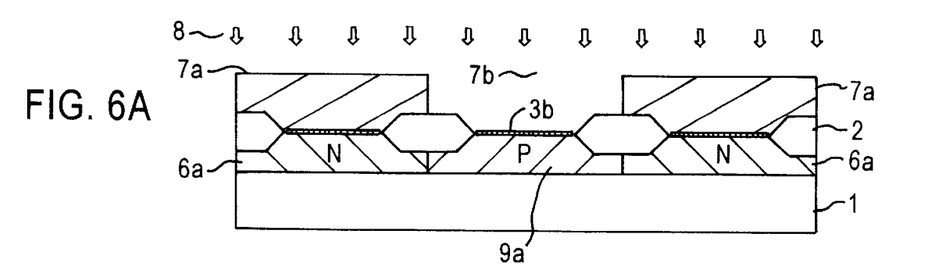
FIGS. 6A to 6D are cross-sectional views (part 2) arranged in sequential order of steps of a semiconductor device manufacturing method of forming wells by ion implantation according to the second embodiment.
Figure 6B:
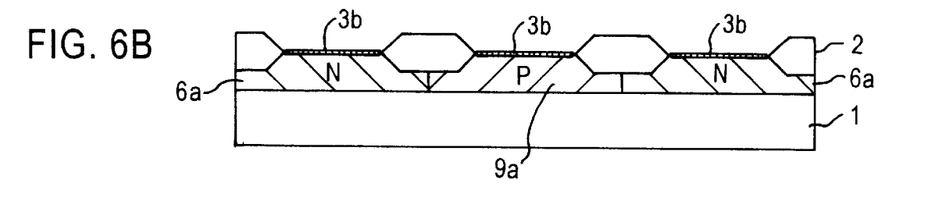
Figure 6C:
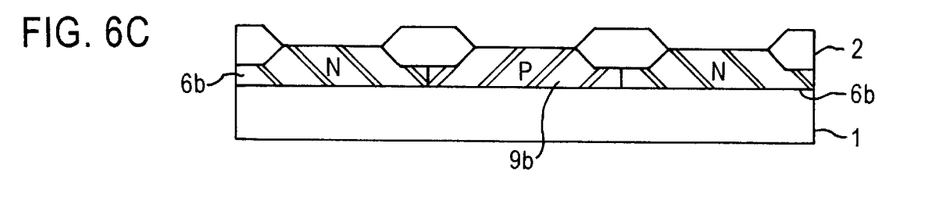
Figure 6D:
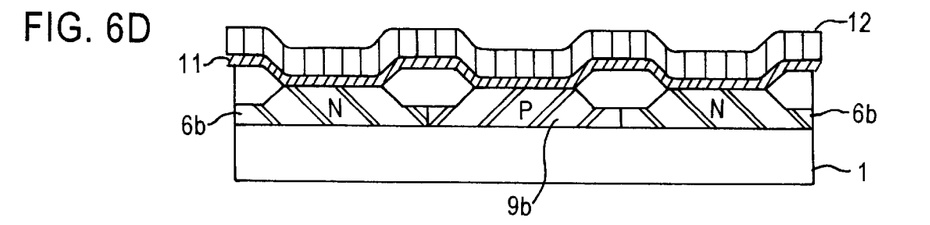
Figure 7:
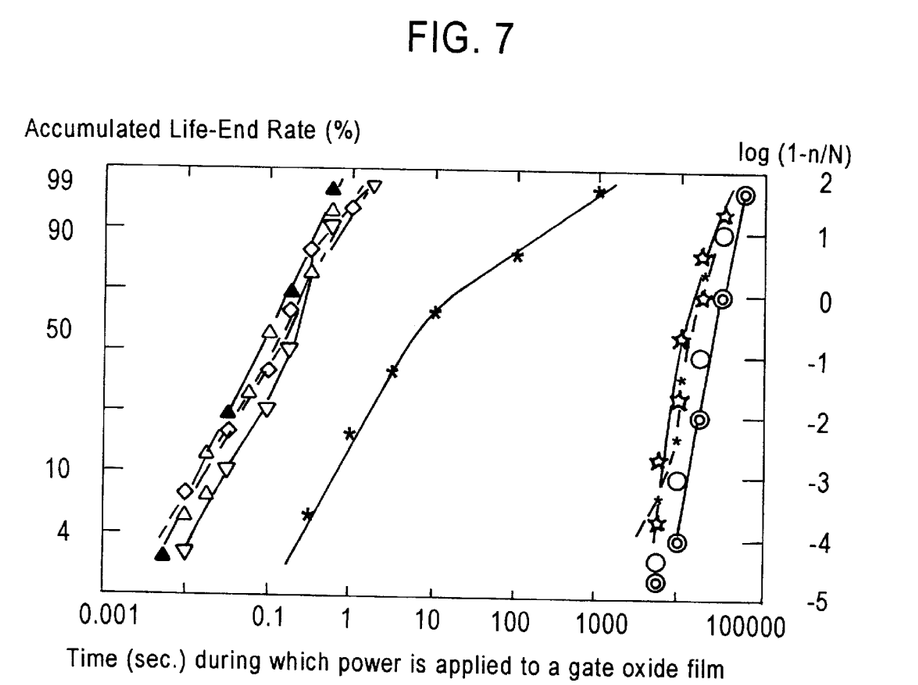
FIG. 7 is a life evaluation plot for a gate oxide film showing an annealing effect after implantation of phosphor ions according to the second embodiment.
Figure 8:
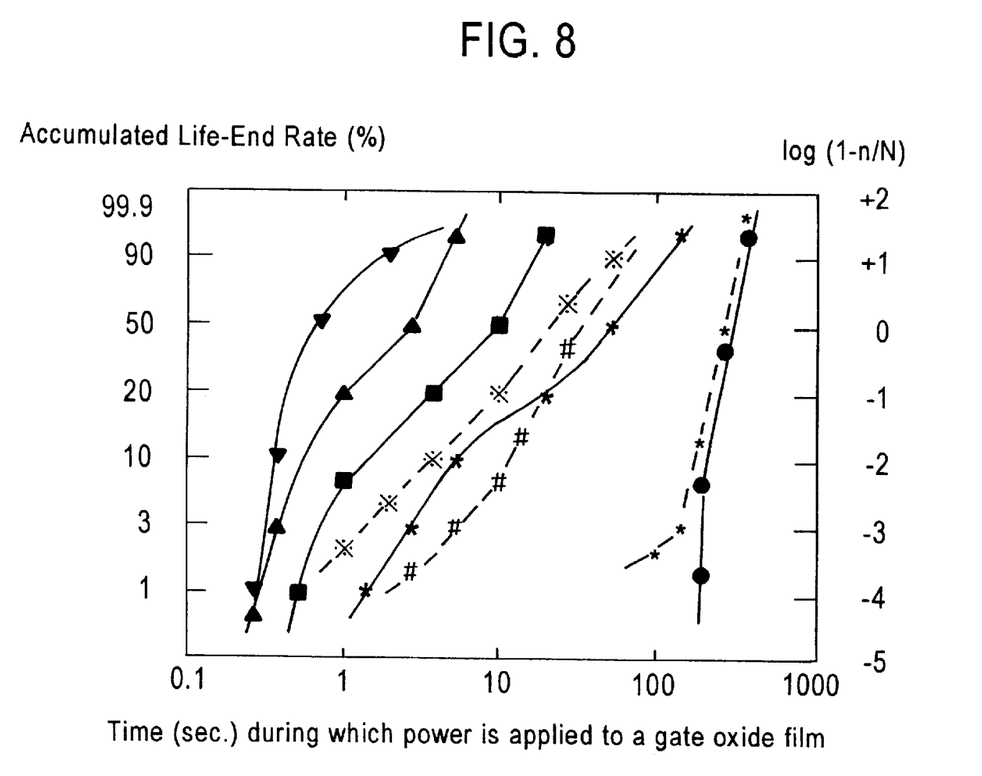
FIG. 8 is a life evaluation plot for a gate oxide film showing the influence of implantation energy of phosphor ions and implantation of polyvalent ions, according to the first embodiment.

FIGS. 5 through 8 are views for explaining a semiconductor device manufacturing method of forming a well by ion implantation according to a second embodiment of the present invention. FIGS. 5 and 6 are cross-sectional views arranged in sequential order of steps of a semiconductor device manufacturing method. FIG. 7 is a life evaluation plot for a gate oxide film showing an annealing effect after implantation of phosphor ions, and FIG. 8 is a life evaluation plot for a gate oxide film showing the influence of implantation energy of phosphor ions and implantation of polyvalent ions.

Figure 9:
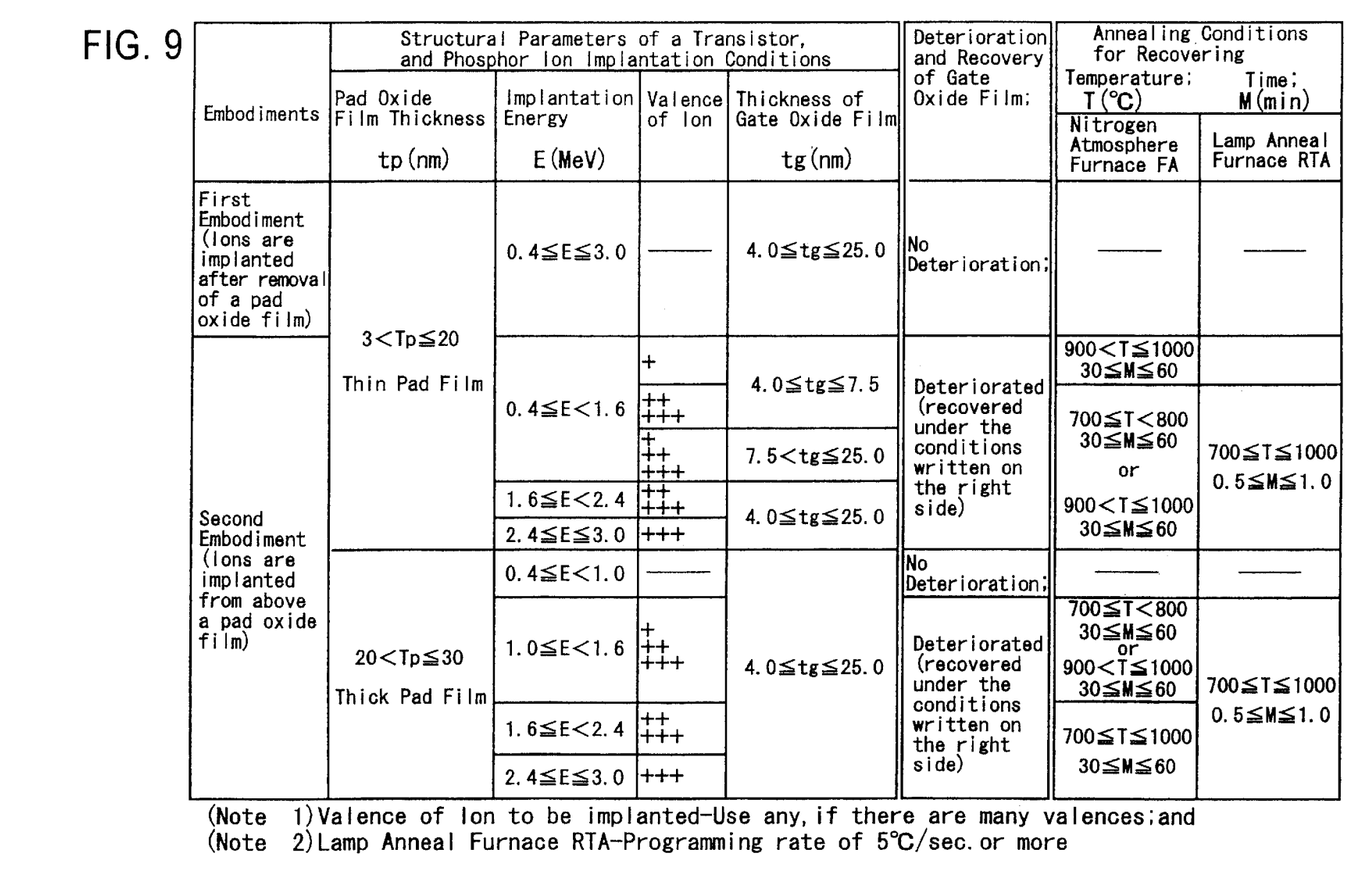
FIG. 9 is a table showing a relationship among transistor structural parameters, conditions for ion implantation, and conditions for heat treatment, all of which affect the reliability and life of a gate oxide film, according to the first and second embodiments.

FIG. 9 is a table showing a relationship among transistor structural parameters, conditions for ion implantation, and conditions for heat treatment, all of which affect the reliability and life of gate oxide films, according to the first and second embodiments.

In the cross-sectional views which are arranged in sequential order and shown in FIGS. 5 and 6, the elements which are identical with or correspond to those shown in FIGS. 1 and 2 are assigned with the same reference numerals, and their descriptions will be omitted here. In the life evaluation plots shown in FIGS. 7 and 8, the reference numerals which are the same as those used in FIGS. 3 and 4 denote the same or corresponding elements, and hence their descriptions will be omitted here.

The feature of the sequential order of steps of a manufacturing method according to the second embodiment will be described by reference to FIGS. 5 and 6.

FIG. 5A shows the isolating oxide films 2 formed on a P-type silicon semiconductor substrate 1 by means of thermal oxidation (a step of forming an element region).

In a step shown in FIG. 5B, a silicon nitride $Si_3N_4$ films which will become the pad nitride films 3b is formed to a thickness of 15 nm on the surface of the element region of the silicon substrate 1 by means of CVD (a step of forming a pad film). A resist mask 4a is formed on the pad nitride film 3b and the isolating oxide film 2.

In a step shown in FIG. 5C, monovalent phosphor ions 5 are implanted as N-type impurities at, e.g., implantation energy of 1.2 MeV and a dose of $1 \times 10^{13}$ ions/cm$^2$, into the substrate from above the pad nitride films 3b which are exposed in the openings 4b by patterning. As a result of high-energy ion implantation, the N-type ion-implanted layers 6a are formed in the given P-type element formation regions below the openings 4b. In a step shown in FIG. 5D, only the resist mask 4a is removed from the substrate on which the N-type ion-implanted layers 6a have been formed (a step of forming a well). Next, as shown in FIG. 5E, a new resist mask 7a is formed while the pad nitride films 3b shown in FIGS. 5B to 5D are left as are on the substrate 1.

In a step shown in FIG. 6A, monovalent boron ions 8 are implanted as P-type impurities at, e.g., implantation energy of 0.7 MeV and a dose of $1 \times 10^{13}$ ions/cm$^2$, into the substrate from above the pad nitride films 3b which are exposed on the openings 7b by patterning. As a result of high-energy ion implantation, the P-type ion-implanted layers 9a are formed in the given P-type element formation regions below the openings 7b (a step of forming a well).

In a step shown in FIG. 6B, the surface of the ion-implanted layers 6a and 9a are annealed under conditions for heat treatment, i.e., at 750° C. for 30 min. or at 1000° C. for 60 min. in a nitrogen atmosphere in a state where the pad nitride films 3b are left on the substrate. Alternatively, the substrate may be annealed in as short a period of time as 30 to 60 seconds at 700 to 1000° C. in a lamp anneal furnace which has a rapid thermal annealing (RTA) characteristic and in which a temperature increases at a rate of 5° C./sec of more (an annealing step).

The knocked-on oxygen atoms formed in the vicinity of the surface of the substrate or the crystalline imperfections in the silicon substrate are taken into or removed by the pad nitride films 3b, so that the surface of the ion-implanted layers 6a and 9a is purified. Subsequently, in a step shown in FIG. 6B, the pad nitride films 3b are removed by a thermo-phosphoric acid.

In a step shown in FIG. 6D, the gate oxide film 11 is formed over the surface of the N-type wells 6b and the P-type well 9b, as well as in the case of the first embodiment (a step of forming a dielectric film). Subsequently, a gate electrode conductive film 12 is formed on the gate oxide film 11.

A modification of the second embodiment will now be described.

The pad nitride film 3b shown in FIG. 5B is only one example of a pad film. Instead of a nitride silicon $Si_3N_4$ film, the following materials can be used as a pad film in the same sequential order of steps as those used in the second embodiment.

(v) The silicon oxide $SiO_2$ film, which has already been described for the first embodiment, can be formed to a thickness of 3 through 30 nm.

(vi) Alternatively, there may be used as the pad film a silicon oxide $Si_xO_y$ film having a stoichiometric amount of oxygen smaller than that of $SiO_2$ mentioned previously; a nitride-oxide silicon $Si_xO_yN_z$ film thermally oxidized in a gaseous atmosphere of nitrogen monoxide or dinitrogen monoxide; or a silicon nitride $Si_xN_y$ film having a stoichiometric amount of nitrogen smaller than that of $Si_3N_4$ mentioned previously.

(vii) Material selected from various types of silicides, e.g., $CoSi_2$, $TiSi_2$, $WSi_2$, and titanium nitride TiN, may also be used as the pad film.

(viii) In addition to a single-layer pad film, a multilayered pad film may also be used. For example, a multilayered pad film comprising a silicon oxide film having a thickness of 5 nm and a silicon nitride film which has a thickness of 10 nm and is laid on the silicon oxide film may be formed in place of a silicon oxide film having a thickness of 15 nm.

Another modification of the second embodiment will now be described.

The energy of 1.2 MeV at which the monovalent phosphor ions 5 are implanted in the step shown in FIG. 5C is only one example of conditions for ion implantation. The following conditions for ion implantation can be selected in the same sequential order of steps.

(ix) Arsenic ions can be used in place of the phosphor ions 5.

(x) The phosphor ions 5 may be implanted at, e.g., energy of 0.4 to 3.0 MeV and a dose of $1\times10^{12}$ to $1\times10^{14}$ ions/cm$^2$.

(xi) Any one type of monovalent phosphor ions, bivalent phosphor ions, and trivalent phosphor ions may be solely used in place of the phosphor ions 5, or a mixture of ions having different valences may be used in place of the phosphor ions 5. The thus-selected ions may be implanted at, e.g., energy of 0.4 to 3.0 MeV and a dose of $1\times10^{12}$ to $1\times10^{14}$ ions/cm$^2$.

Next, with regard to an aggregation of devices formed according to the modification (v) of the second embodiment, i.e., an aggregation of test devices having a pad oxide film as a pad film, the results of life evaluation of the gate oxide film will be described by reference to FIG. 7. The test devices are manufactured in a manner where phosphor ions are implanted from above the pad oxide film. The results shown in FIG. 7 are depicted by taking the conditions for annealing in a nitrogen atmosphere as parameters.

A curve of solid triangles (▲) shown in FIG. 7 denotes the results of life evaluation of an aggregation of comparative devices to which phosphor ions are implanted from above the pad oxide film and which are not annealed after ion implantation. As is obvious from the drawing, this aggregation of devices has the shortest life among aggregations of devices provided in FIG. 7. A curve of outlined triangles (△) denotes an aggregation of test devices annealed in a nitrogen furnace FA at 750° C. for 60 min. A curve of outlined rhombuses (◇) denotes an aggregation of test devices annealed in the nitrogen furnace FA at 800° C. for 60 min. A curve of reverse outlined triangles (▽) denotes an aggregation of test devices annealed in the nitrogen furnace FA at 900° C. for 60 min. None of these shows any annealing effect. A curve of solid asterisks (★) denotes an aggregation of test devices annealed at 750° C. for 30 min, wherein there is admitted that the annealing is effective in improving the life curve of the gate oxide film. In contrast, as can be seen from the curve of outlined triangles (△) which denotes the aggregation of devices annealed at 750° C. for 60 min. in the FA furnace, the annealing effect of improving the life curve of the gate oxide film is lost. A curve of outlined stars (☆) denotes an aggregation of devices annealed at 1000° C. for 60 min. in the FA furnace. The aggregation denoted by (☆) has recovered a superior life curve which is identical with that of an comparative aggregation to which phosphor ions are not implanted and which is denoted by asterisks (*).

A curve of circles (○) denotes an aggregation of devices annealed at 850° C. for 30 sec. in the lamp anneal RTA furnace, and a curve of concentric circles (◎) denotes an aggregation of devices annealed at 1000° C. for 30 sec. in the same. They are admitted to have a superior life curve.

There are observed complicated variations in the life curves of the gate oxide film annealed in the FA furnace shown in FIG. 7, and there is an extreme difference between the optimum annealing period for the FA furnace and that for the RTA furnace. From these facts, it is verified that the optimum annealing effect is produced only when specific parameters, such as the thickness of a pad film, an implantation energy, the valence of an ion to be implanted, and the thickness of a gate oxide film, are combined in an appropriate manner.

Next, taking an implantation energy and the valence of an ion to be implanted as parameters, the results of life evaluation of the gate oxide film will be described by reference to FIG. 8. Each aggregation of test devices is manufactured to constant specifications, i.e., a pad oxide film having a thickness of 15 nm , a dose of $1\times10^{13}$ phosphor ions/cm$^2$, and a gate oxide film having a film thickness of 10 nm.

As can be seen from the curves of solid circles (●), solid stars (★), solid squares (■), solid triangles (▲), and reverse solid triangles (▼), the life of the gate oxide film tends to become shorter with an increase in the energy at which monovalent ions are implanted within a range of 0.4 to 1.5 MeV.

A curve of sharp symbols (#) denotes an aggregation of devices to which bivalent ions are implanted at an energy of 2.1 MeV. A curve of asterisk-like symbols () denotes an aggregation of devices to which trivalent ions are implanted at a high energy of 3.0 MeV. As is obvious from these curves, the life of the devices having the multivalent ions implanted is superior to that of the devices having the monovalent ions implanted.

FIG. 9 is a table showing a relationship among transistor structural parameters, conditions for ion implantation, and conditions for heat treatment, all of which affect the reliability and life of a gate oxide film according to the first and second embodiments.

With reference to FIG. 9, while parameters relating to the structure and performance of a transistor, such as the thickness of a pad oxide film, an implantation energy, and the thickness of a gate oxide film, are fixed within a given range, an explanation will be given of conditions for implantation of phosphor ions under which the life curve of the gate oxide film is deteriorated, as well as of annealing conditions after implantation of phosphor ions for the purpose of recovering the life curve of the gate oxide film.

First, an explanation will be given of the conditions under which the life curve of the gate oxide film is not deteriorated by implantation of phosphor ions. With regard to the structure according to the first embodiment in which ions are implanted into the substrate after removal of the pad oxide film, a combination of the thickness of the pad oxide film ranges from 3 to 30 nm, the implantation energy ranges from 0.4 to 3.0 MeV, and the thickness of the gate oxide film ranges from 4 to 25 nm is verified as a conditions which causes no deterioration to the life of the gate oxide. In contrast, with regard to the structure according to the second embodiment in which ions are implanted into the substrate from above the pad oxide film, it is verified that the ranges which cause no deterioration of the gate oxide film are limited to as below; the thickness of the pad oxide film ranges from 20 to 30 nm, the implantation energy ranges from 0.4 to 1.0 MeV, and the thickness of the gate oxide film ranges from 4 to 25 nm. In short, it is proven that, with regard to the structure according to the second embodiment, the thickness of the pad oxide film is limited to more than 20 nm and an implantation energy is limited to an energy range lower than that of the first embodiment.

Next, an explanation will be given of conditions under which the life curve of the gate oxide film is deteriorated as a result of implantation of phosphor ions and the life curve is recovered as a result of annealing which is performed after the implantation of phosphor ions. First, with regard to the structure according to the second embodiment in which ions are implanted into the substrate from above the pad oxide film, an explanation will be given of a case in which the thickness of the pad oxide film which has a comparative large thickness ranges from 20 to 30 nm, the implantation energy ranges from 1.0 to 3.0 MeV, and the thickness of the gate oxide film ranges from 4 to 25 nm . Within a low implantation energy range from 1.0 to 1.6 MeV, there are two ranges of post-implantation annealing conditions under which the life curve is recovered: that is, a range from 700 to 800° C. and a range from 900 to 1000° C. However, within a high ion implantation energy range of 1.6 MeV or more, there do no arise complicated changes in the life curve of the gate oxide film, i.e., the deterioration or recovery of life of the gate oxide film, such as those observed during the annealing operation in the FA furnace shown in FIG. 7. Accordingly, there exists only one range of post-implantation annealing conditions. As shown in FIG. 9, it is found that the annealing conditions according to the high ion implantation energy range of 1.6 MeV or more range from 700 to 1000° C.

In contrast to the case of a thick pad oxide film, in a case where the pad oxide film is as thin as less than 20 nm, as shown in the middle row of the table provided in FIG. 9, it is found that there is obtained only one range of annealing conditions, i.e., an implantation energy of 1.6 MeV or less, the gate oxide film having a thickness of less than 7.5 nm, and a monovalent ion.

In the lamp anneal RTA furnace, it is verified that the life curve of the gate oxide film can be recovered with regard to all the parameters relating to the structure and performance of the transistor shown in FIG. 9, by annealing the substrate at 700 to 1000° C. for a short period of time, i.e., 0.5 to 1.0 min.

As has been described above, the semiconductor device manufacturing method according to the second embodiment for forming a well by ion implantation is characterized by the substrate being inevitably annealed in the nitrogen furnace or the RTA furnace after ions have been implanted to the substrate from above the pad film.

Further, the present invention is not limited to these embodiments, but variations and modifications may be made without departing from the scope of the present invention.

What is claimed is:

1. A method of manufacturing a semiconductor device, comprising the sequential steps of:

forming an element region by separating the surface of a semiconductor substrate through use of a plurality of isolating oxide films;

forming a pad film on the surface of the element region;

forming a resist mask having an opening in a first given region on the pad film and on the isolating oxide film;

removing the pad film from the inside of the opening;
   forming a well in the semiconductor substrate by implantation of ions of the first conductivity type into the opening;

removing the resist mask; and forming a dielectric film for use as a gate dielectric film on the surface of the well by means of thermal oxidation.

2. The semiconductor device manufacturing method as defined in claim 1, further comprising the steps of:

forming a resist mask having an opening in a second given region on the pad film and the isolating oxide film;

removing the pad film from the inside of the opening;

forming a well in the semiconductor substrate by implantation of ions of the second conductivity type into the opening; and removing the resist mask; and wherein the formation of the resist mask, the removal of the pad film, and the formation of the well are provided between the formation of the pad film and the formation of the dielectric film.

3. The semiconductor device manufacturing method as defined in claim 1, further comprising the steps of:

forming a resist mask having an opening in a second given region on the pad film and the isolating oxide film;

forming a well in the semiconductor substrate still having the pad film formed thereon by implantation of ions of the second conductivity type into the opening; and removing the resist mask; and wherein the formation of the resist mask, the formation of the well, and the removal of the resist mask are provided between the formation of the pad film and the formation of the dielectric film.

4. The semiconductor device manufacturing method as defined in claim 1, further comprising the steps of:

forming a sacrificial oxide film through thermal oxidation on the surface of the well from which the pad film is removed; and removing the sacrificial oxide film; and wherein the formation of the sacrificial oxide film and the removal of the sacrificial film are provided between the formation of the well and the formation of the dielectric film.

5. A semiconductor device manufacturing method comprising the steps of:

forming an element region by separating the surface of a semiconductor substrate through use of an isolating oxide film;

forming a pad film on the surface of the element region;

forming a resist mask having an opening in a first given region on the pad film and on the isolating oxide film;

forming a well in the semiconductor substrate still having the pad film formed thereon by implantation of ions of the first conductivity type into the opening;

removing the resist mask;

annealing the surface of the well having the pad film still formed thereon in a nitrogen atmospheric furnace or a rapid thermal annealing furnace;

removing the pad film; and forming a dielectric film for use as a gate dielectric film on the surface of the well by means of thermal oxidation.

6. The semiconductor device manufacturing method as defined in claim 5, further comprising the steps of:

forming a resist mask having an opening in a second given region on the pad film and the isolating oxide film;

forming a well in the semiconductor substrate still having the pad film formed thereon by implantation of ions of the second conductivity type into the opening; and removing the resist mask; and wherein the formation of the resist mask, the formation of the well, and the removal of the resist mask are provided between the formation of the pad film and the annealing of the well.

7. The semiconductor device manufacturing method as defined in claim 1, wherein the step for forming the pad film comprises formation of a silicon oxide film of a thickness within a range of 3 to 30 nm by means of thermal oxidation of a semiconductor silicon substrate.

8. The semiconductor device manufacturing method as defined in claim 4, wherein the step for forming the sacrificial oxide film comprises formation of a silicon oxide film of a thickness within a range of 1 to 30 nm by means of thermal oxidation of the semiconductor silicon substrate.

9. The semiconductor device manufacturing method as defined in claim 1, wherein the step for forming the dielectric film comprises formation of a silicon oxide film of a thickness thin a range of 4 to 25 nm by means of thermal oxidation of he semiconductor silicon substrate.

10. The semiconductor device manufacturing method as defined in claim 4, wherein the step for forming the pad film comprises formation of a silicon oxide film by means of thermal oxidation of a semiconductor silicon substrate at temperature within a range of 1000 to 1100° C.;

the step for forming the sacrificial oxide film comprises formation of a silicon oxide film by means of thermal oxidation of a semiconductor silicon substrate at temperature lower than that of the pad film formation step; and the step for forming the dielectric film comprises formation of a silicon oxide film by means of thermal oxidation of the semiconductor silicon substrate at temperature lower than that of the sacrificial oxide film step.

11. The semiconductor device manufacturing method as defined in claim 1, wherein the step for forming the pad film comprises formation of a silicon nitride film of a thickness within a range of 3 to 30 nm by means of CVD.

12. The semiconductor device manufacturing method as defined in claim 1, wherein the step for forming the well comprises solo use of any of monovalent, bivalent, or trivalent ions or combined use of ions having different valences, said ions being any of phosphor, arsenic, or boron.

13. The semiconductor manufacturing method as defined in claim 5, wherein the step for annealing the well comprises heat treatment at temperature within a range of 700 to 1000° C. for a period within a range of 30 to 60 mn. in the nitrogen atmospheric furnace or heat treatment at temperature within a range of 700 to 1000° C. for a period within a range of 30 to 60 sec. at a temperature rise rate of 5° C./sec. or more in the rapid thermal annealing furnace.

14. The semiconductor device manufacturing method as defined in claim 1, wherein the step for forming the pad film comprises formation of a pad film into a single-layer structure or a multilayered structure from material selected from silicon oxide ($SiO_2$), silicon oxide ($Si_xO_y$) having a stoichiometric amount of oxygen smaller than that of silicon oxide ($SiO_2$), nitride-oxide silicon ($Si_xO_yN_z$), silicon nitride ($Si_3N_4$), silicon nitride ($Si_xN_y$) having a stoichiometric amount of nitrogen smaller than that of silicon nitride ($Si_3N_4$), silicide ($CoSi_2$, $TiSi_2$, $WSi_2$), or titanium nitride (TiN).

* * * * *